United States Patent [19]

D'Haeseleer et al.

[11] Patent Number: 5,619,419
[45] Date of Patent: Apr. 8, 1997

[54] METHOD OF CELL PLACEMENT FOR AN ITEGRATED CIRCUIT CHIP COMPRISING INTEGRATED PLACEMENT AND CELL OVERLAP REMOVAL

[75] Inventors: Patrik D'Haeseleer, Atherton; Douglas B. Boyle, Palo Alto, both of Calif.

[73] Assignee: LSI Logic Corporation, Milpitas, Calif.

[21] Appl. No.: 306,182

[22] Filed: Sep. 13, 1994

[51] Int. Cl.⁶ ........................................... G06F 15/00
[52] U.S. Cl. .................. 364/490; 364/491; 364/489; 364/488
[58] Field of Search ..................... 364/488, 489, 364/490, 491, 578, 468

[56] References Cited

U.S. PATENT DOCUMENTS

| | | | |
|---|---|---|---|
| 4,593,363 | 6/1986 | Burstein et al. | 364/491 |
| 5,191,542 | 3/1993 | Murofushi | 364/491 |
| 5,208,764 | 5/1993 | Rusu et al. | 364/490 |
| 5,225,991 | 7/1993 | Dougherty | 364/491 |
| 5,341,308 | 8/1994 | Mendel | 364/489 |
| 5,349,536 | 9/1994 | Ashtaputre et al. | 364/491 |
| 5,363,313 | 11/1994 | Lee | 364/491 |
| 5,475,608 | 12/1995 | Masuoka | 364/488 |
| 5,495,419 | 2/1996 | Rostoker et al. | 364/468 |

OTHER PUBLICATIONS

Wipfler, M. Wiesel and Mlynski, D.A., *A Combined Force and Cut Algorithm for Hierarchical VLSI Layout*; Design Automation Conference, 1982 Jan. 1982.

Friedman, M., McDonald, Donlan, LT.B., McDonald, J. and Brooksbank, D.; *The R.P.I. Wafer Scale Integration Silicon Compiler*; International Conference on Computer Design, Jan. 1984.

Odowara, G., Hiraide, T. and Nishina, O.; *Partitioning and Placement Technique for CMOS Gate Arrays*; Transactions on Computer Aided Design, Jan. 1987.

Murofushi, M., Yamada, M., and Mitsuhashi, T.; *FOLM-planner: A New Floorplanner with a Frame Overlapping Floorplan Model Suitable for SOG (Sea of Gates) Type Gate Arrays*; International Conference on Computer Aided Design, Jan. 1990.

*Primary Examiner*—Kevin J. Teska
*Assistant Examiner*—Jacques Louis-Jacques
*Attorney, Agent, or Firm*—Poms, Smith, Lande & Rose

[57] ABSTRACT

A method of cell placement for an integrated circuit chip includes performing a chaotic improvement operation on an initial cell placement. At least some of the cells are relocated to new locations that provide lower interconnect wirelength and congestion. For each cell, the centroid of the net of cells to which the cell is connected is computed. The cell is then moved toward the centroid by a distance that is equal to the distance from the current position of the cell to the centroid multiplied by a "chaos" factor $\lambda$. The value of $\lambda$ is selected such that the cell relocation operations will cause the placement to converge toward an optimal configuration without chaotic diversion, but with a sufficiently high chaotic element to prevent the optimization operation from becoming stuck at local fitness maxima. The chaotic placement operation can generate illegal placements in which two or more cells can occupy one location, some locations can contain no cells and/or two or more cells can partially overlap. Cell overlap is reduced and the spatial distribution of the placement improved by computing a density map representing cell densities in incremental blocks of the placement respectively, computing, from the density map, a warp map representing first repulsive forces exerted at centers of said blocks by cell densities in surrounding blocks respectively, interpolating, from the warp map, second repulsive forces acting on selected cells in the placement and spatially distributing the selected cells in accordance with the second repulsive forces. Overlapping cells are then moved away from each other by a separate cell-to-cell repulsive force based on cell overlap to reduce any remaining overlap. The chaotic placement and spatial distribution phases are repeated, with the scale of movement for chaotic placement being progressively decreased and the scale of movement for spatial distribution being progressively increased. A final phase is then performed in which only the cell-to-cell repulsive force is used to eliminate the remaining overlap.

42 Claims, 5 Drawing Sheets

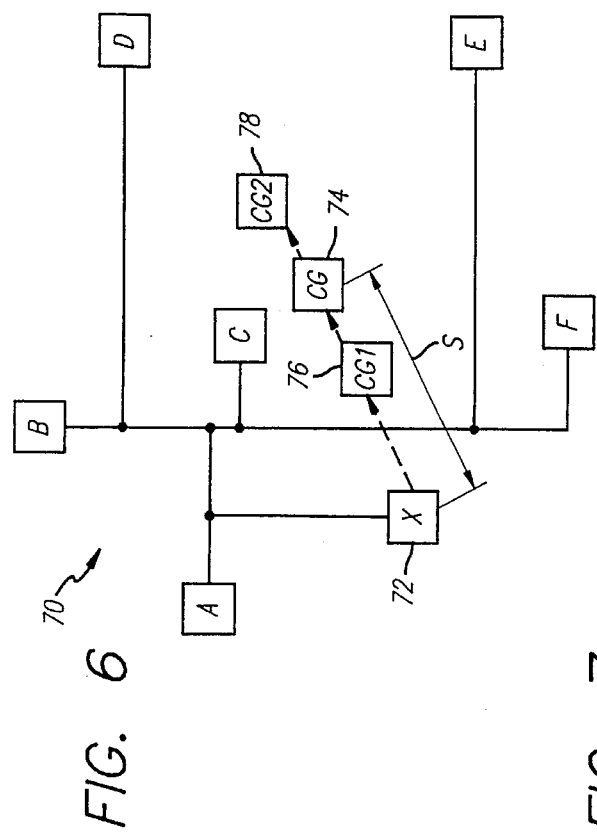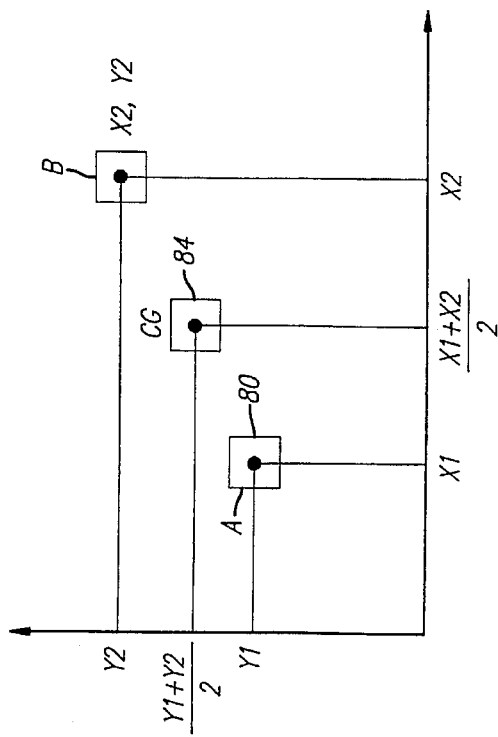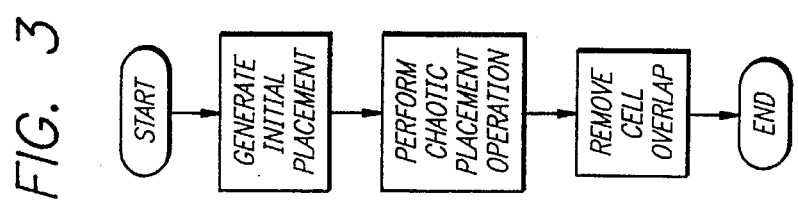

METHOD OF CELL PLACEMENT FOR AN ITEGRATED CIRCUIT CHIP COMPRISING INTEGRATED PLACEMENT AND CELL OVERLAP REMOVAL

BACKGROUND OF THE INVENTION

1. Field of the Invention

The present invention generally relates to the art of microelectronic circuit fabrication, and more specifically to a method of cell placement for an integrated circuit chip comprising chaotic placement and cell overlap removal.

2. Description of the Related Art

The automated physical design of a microelectronic integrated circuit is a specific, preferred example of simultaneous optimization processing using a parallel processing architecture to which the present invention is directed.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield.

Currently available physical design automation systems are limited in that they are only capable of placing and routing approximately 20,000 devices or cells. Placement of larger numbers of cells is accomplished by partitioning the cells into blocks of 20,000 or less, and then placing and routing the blocks. This expedient is not satisfactory since the resulting placement solution is far from optimal.

A number of methodologies have been proposed for the improvement or optimization of cell placements, which generally produce placements comprising approximate positions for cells, and allow overlaps between cells that are not "legal" in a "feasible" or realizable placement. There remains a need in the art for a method of efficiently removing such cell overlaps that is applicable to large placements including hundreds of thousands or more cells.

SUMMARY OF THE INVENTION

A method of cell placement for an integrated circuit chip in accordance with the present invention overcomes the limitations of the prior art and enables a highly optimized placement to be produced in a relatively short period of time.

Another goal that is accomplished by the present invention is to provide a method of efficiently removing cell overlaps that is applicable to large placements including hundreds of thousands or more cells.

More specifically, the present method includes performing a chaotic improvement operation on an initial cell placement. At least some of the cells are relocated to new locations that provide lower interconnect wirelength and congestion.

For each cell, the centroid of the net of cells to which the cell is connected is computed. The cell is then moved toward the centroid by a distance that is equal to the distance from the current position of the cell to the centroid multiplied by a "chaos" factor $\lambda$.

The value of $\lambda$ is selected such that the cell relocation operations will cause the placement to converge toward an optimal configuration without chaotic diversion, but with a sufficiently high chaotic element to prevent the optimization operation from becoming stuck at local fitness maxima.

The chaotic placement operation can generate illegal placements in which two or more cells can occupy one location, some locations can contain no cells and/or two or more cells can partially overlap.

Cell overlap is reduced and the spatial distribution of the placement improved by computing a density map representing cell densities in incremental blocks of the placement respectively, computing, from the density map, a warp map representing first repulsive forces exerted at centers of said blocks by cell densities in surrounding blocks respectively, interpolating, from the warp map, second repulsive forces acting on selected cells in the placement and spatially distributing the selected cells in accordance with the second repulsive forces by a separate cell-to-cell repulsive force based on cell overlap.

Overlapping cells are then moved away from each other to further reduce any remaining overlap. The chaotic placement and spatial distribution phases are repeated, with the scale of movement for chaotic placement being progressively decreased and the scale of movement for spatial distribution being progressively increased.

Any remaining cell overlap can be eliminated in a final phase in which only the cell-to-cell repulsive force is used, resulting in a legal placement.

3

These and other features and advantages of the present invention will be apparent to those skilled in the art from the following detailed description, taken together with the accompanying drawings, in which like reference numerals refer to like parts.

DESCRIPTION OF THE DRAWINGS

FIG. 3 is a flowchart illustrating the present method;

FIG. 4 is a diagram illustrating how illegal placements can be generated upon completion of a first step of the method;

FIG. 5 is a diagram illustrating how the illegal placements of FIG. 4 are eliminated by performing a second step of the method;

FIG. 6 is a diagram illustrating a method of optimally relocating a cell in a placement using a chaotic optimization method of the invention;

FIG. 7 is a diagram illustrating computation of a center of gravity of a cell net for practicing the method of FIG. 6;

DETAILED DESCRIPTION OF THE INVENTION

Figure 1:
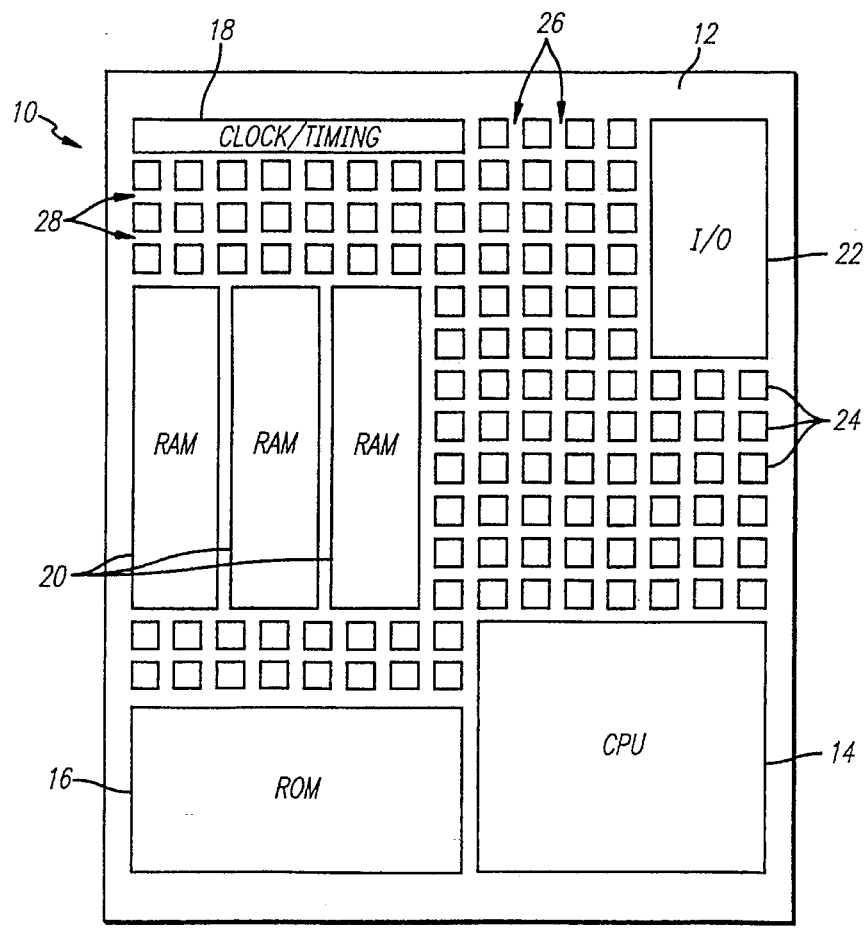
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
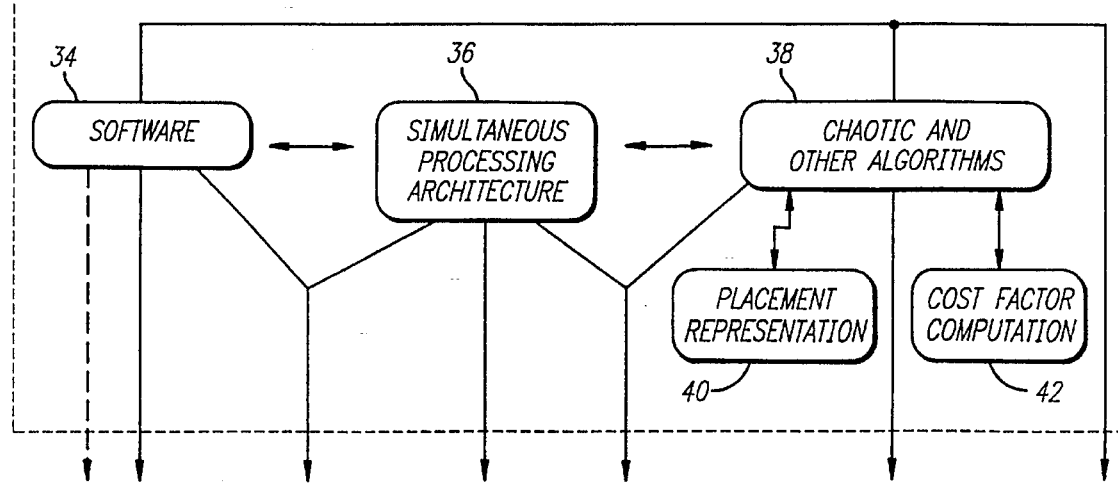
FIG. 2 is a diagram illustrating the main blocks of a multi-processing optimization system for practicing a method of the present invention.

FIG. 2 illustrates an integrated circuit physical design automation system 30 for producing an optimized placement of the cells 24 such as illustrated in FIG. 1 in accordance with a method of the present invention.

The system 30 receives inputs for a user specified integrated circuit design including a netlist, a library of standardized microelectronic elements or cells and functional units including combinations of cells, and a set of rules that define the objectives of the design.

The system 30 decomposes these inputs into a plurality of parallel processes or tasks that are executed simultaneously using individual processing units. In general, one or more processors coordinate the operation of other processors, which are optimized, evaluated and recombined to produce an optimal cell placement which may or may not satisfy a predetermined performance objective.

The optimal cell placement produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or algorithms 38 for measuring the relative fitnesses of cell placements and optimizing the fitnesses, Implementation of the algorithms 38 is facilitated by a cell placement representation 40 and cost function or factor computation 42. The architecture 36 can be of any type, such as Distributed Shared Memory (DSM), that enables parallel processing in accordance with the method of the invention.

A method of cell placement for an integrated circuit chip comprising chaotic placement and spatial distribution is illustrated in the flowchart of FIG. 3. First, an initial cell placement is generated either randomly or using a suitable algorithm.

Next, a chaotic placement improvement or optimization operation that will be described in detail below is performed on the initial placement. This operation is capable of being performed on a very large number of cells in a short period of time, but is capable of generating illegal placements.

The improved placement resulting from the chaotic placement operation is then subjected to subsequent processing that removes illegal cell placements to provide a legal placement by spatially distributing or expanding overlapping or dense clumps of cells.

As illustrated in FIG. 4, a placement 50 that is produced by performing the chaotic placement operation includes cells 52 that are placed in relatively fit positions depending on the cell interconnect congestion in the placement 50. However, the placement 50 may not be perfect, in that it contains some illegally placed cells.

For example, the reference numerals 52a, 52b and 52c designate pairs of cells 52 that partially overlap. Pairs of cells that completely overlap, or occupy the same locations in the placement 50, are indicated at 52d and 52e. Further illustrated are cell locations 54a and 54b in the placement 50 that do not contain any cells.

FIG. 5 illustrates a cell placement 60 that results from further processing the placement 50 to relocate the illegally placed cells 52a to 52e. It will be seen that the placement 60 does not include any illegally placed cells, and each cell 52 is properly located in a respective location in the placement 60.

Although the present method can be practiced serially using a single processor, it is preferably performed using a plurality of parallel processors in accordance with the process decomposition described above with reference to FIG. 2.

The first step of the present method, the chaotic placement improvement or optimization operation, is illustrated in FIG. 6. A net 70 constitutes a subset of a placement of cells, and includes a cell X in a current or initial location 72, and cells A to F that are interconnected with the cell X in the net 70. It will be noted that a netlist for the placement includes all of the nets and the cells that are interconnected thereby respectively. With the cell X in the initial location 72, the cell interconnect congestion and fitness of the placement are assumed to be less than optimal.

The fitness of the placement is improved in accordance with the chaotic placement improvement operation by relocating at least some of the cells to more suitable locations. This is done for each cell that is to be relocated by computing a location 74 of a centroid CG of the other cells in the net 72 and any other nets to which the cell X is connected. For the purposes of the invention, the term "centroid" is defined as a general term to indicate a position calculated for the cell based on the positions of the other cells in order to improve the placement of the cell. For example, center of gravity, mass, force, area, minimum wirelength position, minimum signal propagation delay, etc.

It is within the scope of the invention to move the cell X directly to the centroid location 74. However, the effectiveness of the method is enhanced by introducing a variable parameter lambda $\lambda$, and multiplying the distance S between the initial location 72 and the centroid location 74 by $\lambda$.

The cell X is then moved from the initial position 72 toward the centroid location 74 by a distance $\lambda S$, such that the distance of movement is proportional to the distance S. If $\lambda=1$, the cell X will be moved exactly to the centroid location 74. If $\lambda$ is less than unity, the cell X will be moved to a location 76 between the initial location 72 and the centroid location 74 as indicated at CG1. If $\lambda$ is greater than unity, the cell X will be moved beyond the centroid location 74 to a location 78 as indicated at CG2.

The value of $\lambda$ is selected such that the cell relocation operations will cause the placement to converge toward an optimal configuration with maximum effectiveness. The factor $\lambda$ is characterized as a "chaos" factor because as its value is increased, the placement optimization progressively diverges. A certain amount of chaos is necessary to prevent entrapment of the process at local fitness optima. However, if the chaos factor $\lambda$ is too high, the process will diverge into a chaotic state in which the results become non-optimally random.

For orthogonal cell placement arrangements, it has been determined experimentally that an optimal solution can be achieved for values of $\lambda$ between 0 and 1.5, more preferably between 0.5 and 1.5.

The present method of placement optimization can also be viewed using the theory of Cellular Automata (CA). The placement is represented as a 2D lattice, with each cell modelled by a finite-state automaton (FSA). The inputs to the FSA are the locations of neighboring cells and the locations of the cells to which the cell is connected through the netlist.

Each FSA consists of a cell state (current location), an input alphabet (positions of neighboring cells), and a transition function $\lambda S$ by which the move to the next location is computed. The CA model is executed for a series of iterations.

The dynamic behavior depends on the transition functions for the FSA and the parameter $\lambda$, which determines how far a cell will move during each iteration. For small values of $\lambda$, the system changes slowly and in some circumstances can become stuck, or "frozen" in a particular state. For moderate values of $\lambda$, the system will converge toward a low energy state. For large values of $\lambda$, the motion of the cells is chaotic and the system tends toward ever higher energy states.

FIG. 7 illustrates how the centroid, in this case the center of gravity or "gravity point" is computed as the first step in determining the location to which a cell is to be moved. The center of gravity computation is illustrated for two cells, A and B, that are at locations 80 and 82 respectively.

The location 80 of the cell A is represented in an orthogonal system of x and y coordinates as x1,y1, whereas the location 82 of the cell B is represented as x2,y2. The x component of a location 84 of the center of gravity CG of the cells A and B is computed as the average of the x components of the locations 80 and 82, more specifically as $(x1+x2)/2$. The y component of the center of gravity CG is computed as the average of the y components of the locations 80 and 82, more specifically as $(y1+y2)/2$.

Although the computation for only two cells is illustrated in FIG. 7, it will be understood that the operation can be generalized for a net comprising any number of cells.

The centroids and values of $\lambda S$ are generally computed as continuous analog values in accordance with the invention. These analog values can be used per se, or can alternatively be rounded off to integer values corresponding to increments of the spacing between adjacent cell locations such that each new computed location corresponds exactly to a cell location of the placement. In the latter case, for some types of netlists, the optimization will tend to freeze at local fitness optima for values of $\lambda$ less than unity, but will converge faster than in an application in which the analog values are used for values of $\lambda$ greater than unity.

The basic method described above does not result in a placement in which each location is occupied by a single cell. Some locations can contain more than one cell, other locations can be vacant and some cells can partially overlap. This is because the method does not take into account the fact that a newly computed location may already be occupied by one or more cells.

After performing the basic chaotic placement operation, an expansion or spatial distribution operation is performed to remove overlap between cells, and improve the spatial distribution of the cells in the placement through cell relocation. This is accomplished by taking into account the cell density in locations proximate to the initial location of a cell that is to be relocated, or alternatively all other cells in the placement.

The second operation spreads out clumps of cells so that the density of cells is more uniform throughout the placement. The attraction between cells in the nets is balanced against repulsion caused by a high local cell density, providing an optimized tradeoff of wirelength, feasibility and congestion. In other words, the second operation provides a cell-to-cell repulsion force that is similar to and complements the cell-to-cell attraction force of the chaotic placement as described above.

It will be noted that the first and second operations can be performed simultaneously in combination. This is accomplished by calculating the cell movements for the chaotic placement and spatial distribution separately, summing these movements together, and performing cell movements using the values produced by the summation.

As with the first operation, the second operation considers cells as being analogous to electrostatically charged particles, and functions by calculating repulsion forces as being analogous to electrostatic repulsion forces between particles.

Calculating repulsion forces acting on a particle by a large number of other particles can be quite time consuming. Provided the repulsion forces are linear with respect to the mass of the particles, and the particles are not too close together, a good approximation for this force can be achieved by summing up the masses of the particles in a density map of the region surrounding the particle for which the force needs to be calculated.

Figure 8:
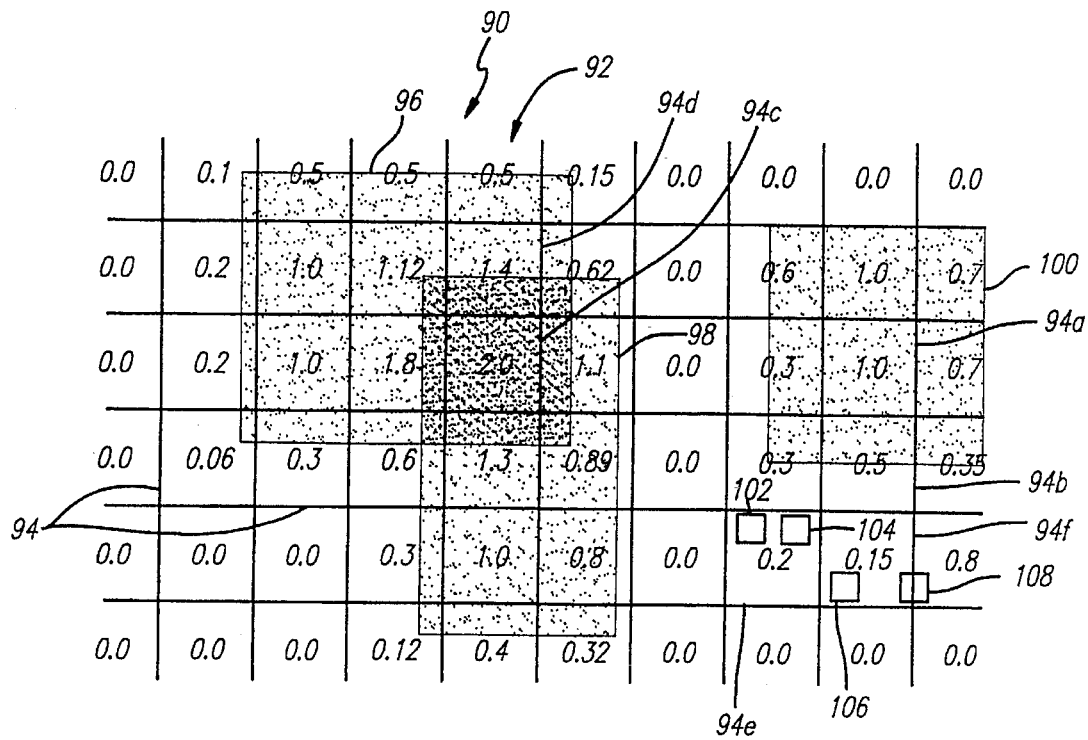
FIG. 8 is a diagram illustrating calculation of a cell density map in accordance with the present method.

The first step of the placement improvement operation is illustrated in FIG. 8, and comprises computing a density map 92 for a placement 90. This is accomplished by dividing the placement 90 into a grid of rectangular (or square) blocks that are collectively designated as 94, and calculating the cell density for each block 94. The invention can be practiced advantageously even if the number of blocks into which the placement is divided is relatively small, such as N=100 and N×N=10,000.

The cell density is calculated as the sum of all areas of a block that are overlapped by a cell. In FIG. 8, an exemplary area of the placement 90 includes three large cells 96, 98 and 100. The cells 96 and 98 overlap each other, whereas the cell 100 is separate.

The entire area of a block 94a is overlapped by the cell 100, such that the cell density of the block 94a is 1.0. One half of the area of a block 94b is overlapped by the cell 100, and the cell density of the block 94b is 0.5. Thus, for a single cell, the cell density for each block that the cell overlaps is equal to the area of the block that is overlapped by the cell.

The principle is essentially similar for the blocks overlapped by the cells 96 and 98. However, several blocks are at least partially overlapped by both cells 96 and 98. In this case, cell density is equal to the sum of the overlap areas.

A block 94c is completely overlapped by both cells 96 and 98, and the cell density thereof is 2.0. A block 94d is completely overlapped by the cell 96, and 0.4 of the area of the block 94d is overlapped by the cell 98. The cell density for the block 94d is therefore 1.0+0.4=1.4. The calculation of the cell density for the other blocks is performed in the same manner.

The placement 90 is further illustrated as comprising small cells 102, 104, 106 and 108, each having an area equal to 0.1 the area of a block 94. A block 94e is overlapped by the two cells 102 and 104, so that its cell density is 0.2. A block 94f is overlapped by the cell 106 and one half of the cell 108, and its cell density is 0.15.

The repulsive effect on a given cell from other cells in the placement 90 can be calculated by assuming that the cell density for each block is approximated by a repulsive force (vector) at the center of the block. This can be represented by a warp field or map 110 as illustrated in FIG. 9 in which the numerical value of the repulsive force for each block 94 is indicated together with an arrow representing the magnitude and direction of the force vector.

Although it is within the scope of the invention to calculate the net repulsive force for each block as the resultant of all other blocks of the placement, the computation time required to do this is very large. For this reason, the force for each block is preferably calculated taking into account only blocks surrounding the respective block in proximate relation thereto, typically within a 10×10 to 20×20 area around the respective block. As illustrated in FIG. 9, the force for a block 94g is calculated as the resultant of the cell densities for a single layer of adjacent blocks on the four sides of the block 94g, as lying within a broken line 112.

If a cell has a center coinciding with the center of one of the blocks 94, the repulsive force on the cell is taken as being equal to the value of the repulsive force of that block of the warp map 110. The cell is moved in the direction of the force vector by a distance equal to the magnitude of the force multiplied by a scale factor. This causes the cells to be moved apart, dense clusters of cells to be expanded and the spatial distribution of cells in the placement 90 to be improved by making the distribution more uniform.

Figure 9:
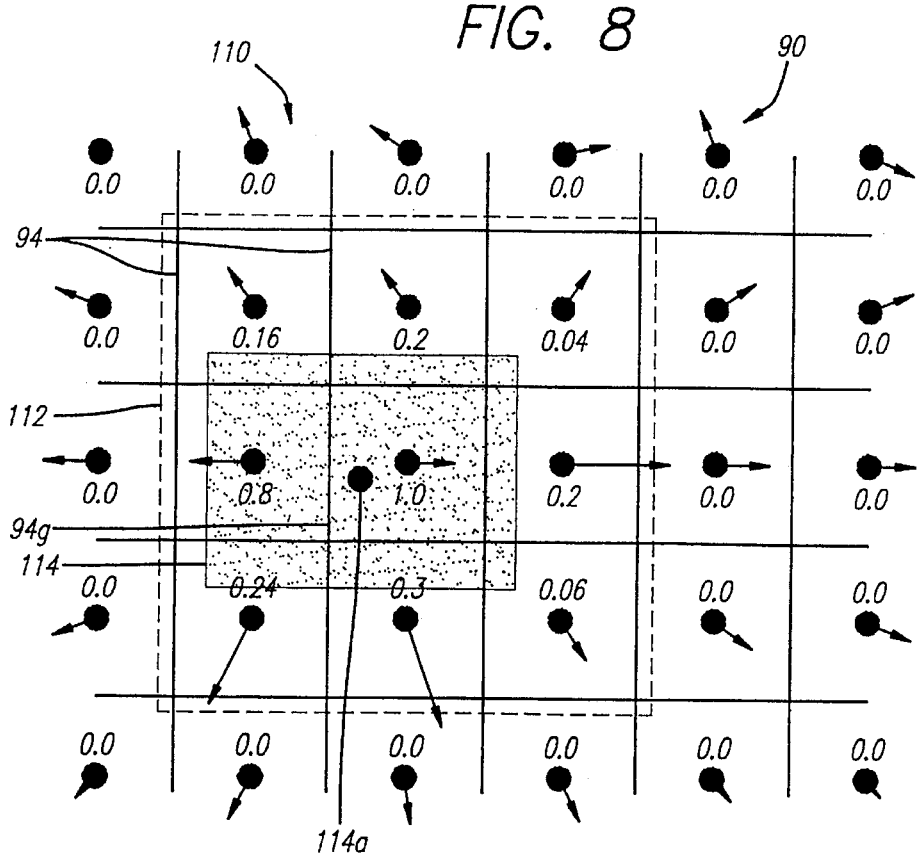
FIG. 9 is a diagram illustrating a warp map calculated from the density map of FIG. 8.

Further illustrated in FIG. 9 is a cell 114 having a center 114a that does not coincide with the center of any of the blocks 94. The force on a cell such as 114 is calculated using linear interpolation between the discrete values of the warp map 110 as will be described in detail below.

The repulsive force between two blocks can be calculated as being inversely proportional to the distance between the blocks or, more preferably in analogous relation to the inverse square law of electrostatics, as being inversely proportional to the square of the distance between the blocks. However, the invention is not so limited, and the repulsive forces that constitute the warp map 110 can be calculated using any other suitable function.

Figure 10:
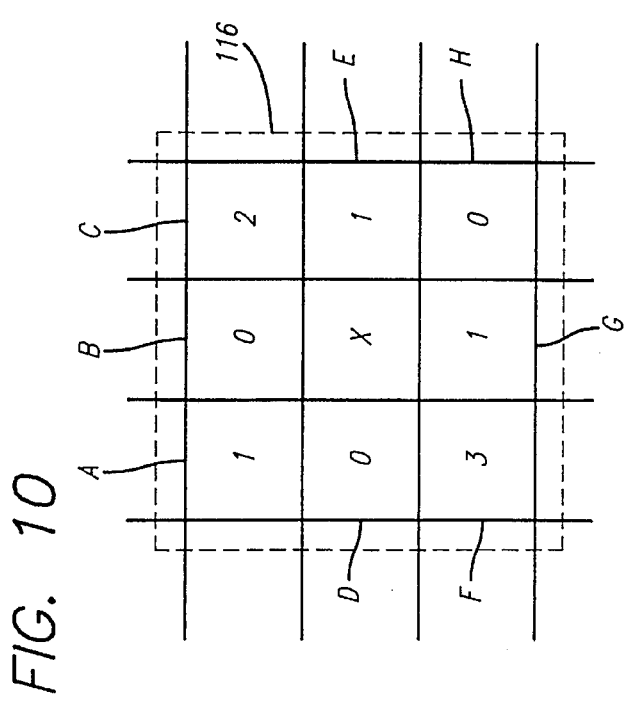
FIG. 10 is a diagram illustrating calculation of individual values of the warp map.

An example illustrating the calculation of the repulsive force for a single block X of a warp map is illustrated in FIG. 10. An exemplary subset of nine blocks, including the block X which is centrally located, and eight blocks A to H that surround the block X, are illustrated as being enclosed by a broken line 116.

The simulated net repulsive force exerted on the block X by the cell densities in the blocks A to H as represented by the density map is based on the inverse square law of electrostatics, such that the repulsive force F between two charged particles of the same electrostatic polarity is given as $F=(Q1 \times Q2)/R^2$, where Q1 and Q2 are the electrostatic charges of the particles and R is the distance therebetween. The net force for the block X is a function only of the cell densities of the blocks A to H. The cell density of the block X itself is not considered.

In the illustrated example, the cell densities of the blocks A to H are as follows: A=1; B=0; C=2; D=0; E=1; F=3; G=1; H=0. The blocks B, D and H which have cell densities of zero do not have any effect on the block X. Alternatively, an empty location may exert an attractive force toward a block.

It will be assumed that each block has a unit charge (Q1=Q2×1), and that the distance between orthogonally adjacent blocks is unity (R=1). The force between two blocks in orthogonally adjacent locations is therefore F=1/1=1.

The distance between two blocks in diagonally adjacent locations is $1 \times 2^{1/2}$. The force between two blocks in diagonally adjacent locations is therefore $1/(2^{1/2})^2=\frac{1}{2}$. The magnitude of each of the x and y components of this force is $1/(2 \times 2^{1/2}) \approx 1/2.83 \approx 0.35$.

Figure 11:
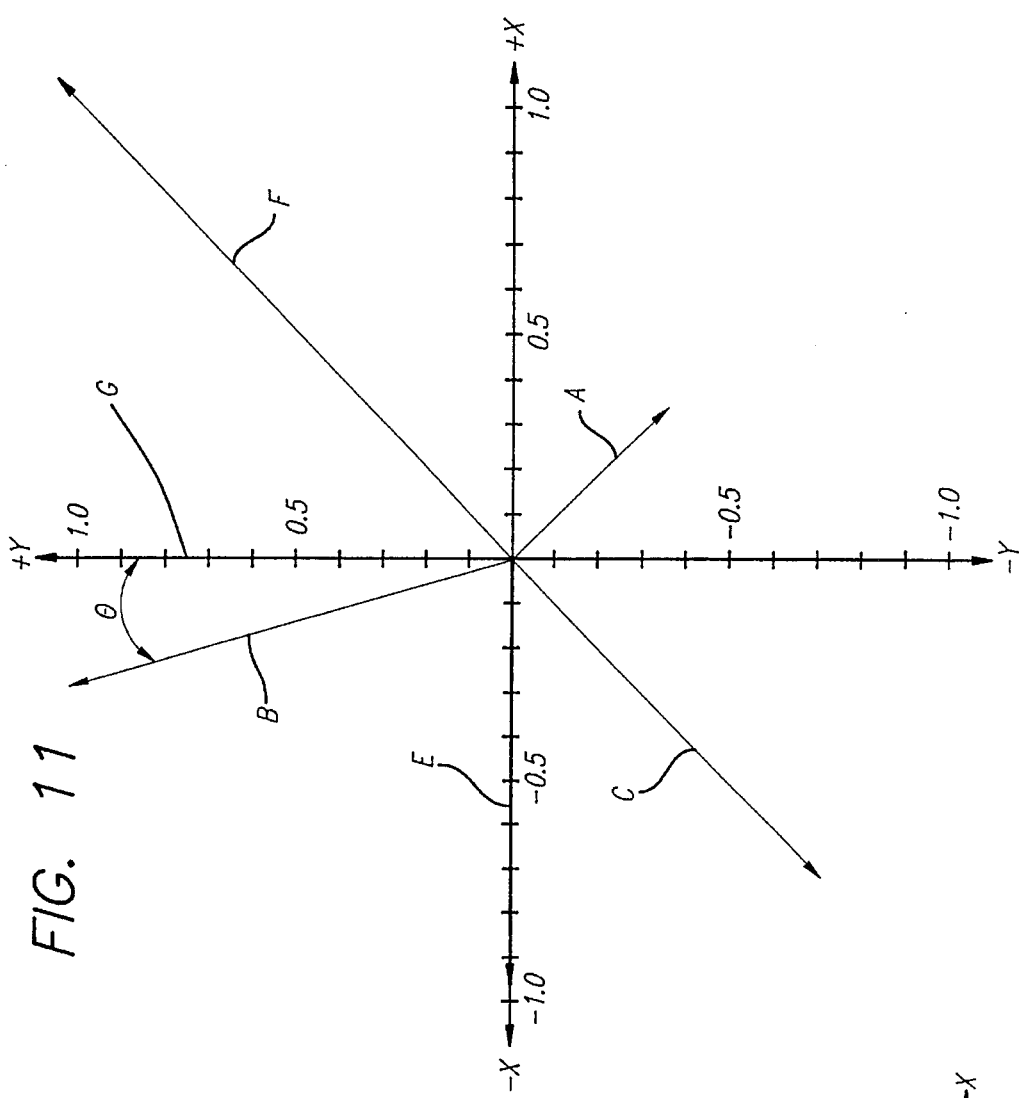
FIG. 11 is a vector diagram illustrating the calculation of FIG. 10.

FIG. 11 is a vector diagram illustrating the forces acting on the block X, in which the vectors are designated by the reference characters A to H correspond to the respective blocks.

The block A has a cell density of 1. The force exerted on the block X by the block A has an x component with a magnitude of 0.35 that acts rightwardly, and a y component with a magnitude of 0.35 that acts downwardly as illustrated.

The block C has a cell density of 2, so that the force twice that of the block A. The force contribution of the block C has an x component with a magnitude of 0.7 that acts leftwardly, and a y component with a magnitude of 0.7 that acts downwardly.

The block E has a cell density of 1, and is orthogonally adjacent to (rightward of) the block X. The force exerted by this block has a magnitude of 1.0 and acts leftwardly.

The block F has a cell density of 3, so that the force is three times that of the block A. The cell density of the block F has an x component with a magnitude of 1.05 that acts rightwardly, and a y component with a magnitude of 1.05 that acts upwardly. The block G has a cell density of 1, and exerts a force with a magnitude of 1.0 in the upward direction.

The resultant of these forces, or the net force exerted on the block X, is designated as a vector R, has a magnitude of 1.09, and is displaced by an angle $\theta=16.7°$ counterclockwise from the positive y axis.

Although the simplified example of FIGS. 10 and 11 includes only eight blocks A to H that surround the single block X, the invention can compute a net force based on a larger number of blocks, or all of the blocks in the placement, using the same principle, or just blocks in the proximate surrounding to reduce computational complexity.

The invention is further not limited to the particular functional computation that was described with reference to FIGS. 10 and 11. For example, the x and y force components can be computed as being functions of simulated attractive, rather than repulsive forces.

Another function that can be utilized to calculate the x and y force components is given as:

$$Fx = \sum_{i=1}^{n} \frac{dx}{[\max|dx_i|, \max|dy_i|]^3} \text{ and}$$

$$Fy = \sum_{i=1}^{n} \frac{dy}{[\max|dx_i|, \max|dy_i|]^3}$$

where Fx and Fy are the x and y net force components; n is the number of blocks that affect a block for which the force is being calculated; dx and dy are the x and y distances between the location of the block for which the force is being calculated and a block for which the force contribution is being computed; and $dx_i$ and $dy_i$ are the x and y components of the distances between the block for which the force is being calculated and the blocks that affect this block.

In the denominator of the equations, the number that is cubed is the maximum value of $dx_i$ or $dy_i$, whichever is larger.

An enhancement to the present method is to subtract the average density over the entire map, resulting in an "excess density" or "difference" map. This assures that cells are not repulsed by areas which have "just enough" cells (excess density=0), and that areas with a shortage of cells (excess density<0), will actively attract cells. This principle can also be applied to the forces in the warp map.

Also, the area outside the placement will have an implicit excess density of 0, so that it has no influence on the movement of the cells within the placement. Otherwise, there would always be a density gradient along the placement border, causing cells to be pushed "off" the placement. Given a proper balance between attraction and repulsion coefficients, present method allows the entire placement to be filled with cells very evenly.

The time complexity or computation time for calculating block-to-block repulsion forces individually is $O(C^2)$, where C is number of blocks and O is the mathematical "order". Calculation of the warp map has a time complexity of $O(N^4)$, where N is the resolution of the density map, and $N^2$ will typically be smaller than C (and may be kept constant for larger values of C). Limiting the resolution of the density map in this way reduces the computational requirements for placing designs with very large numbers of cells. If the warp map is calculated by only looking at a fixed region around each block, the time complexity reduces to $O(N^2)$. The total time complexity for calculation of density map repulsion then becomes $O(C)$.

Figure 12:
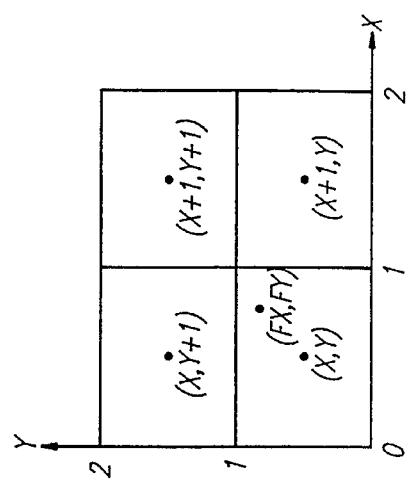
FIG. 12 is a diagram illustrating linear interpolation between values of the warp map.

As discussed above with reference to FIG. 9, calculation of the repulsive force for a cell having a center that does not coincide with the center of a block is performed using linear interpolation between the discrete values of the warp map. As illustrated in FIG. 12, a cell for which the repulsive force is to be calculated is located at a rectangular coordinate position (fx,fy), whereas the centers of blocks that are closest to the position (fx,fy) are designated as (x,y), (x,y+1), (x+1,y) and (x+1,y+1).

The x and y coordinates of the blocks are numbered in consecutive order. The blocks having centers closest to the center of a cell for which the repulsive force is being calculated from the warp map by interpolation are determined by rounding down the values of (fx,fy) to the nearest integer values, and using these values for (x,y), (x,y+1), (x+1,y) and (x+1,y+1).

The x component of the interpolated repulsive force on the cell centered at (fx,fy) is designated as warp_x_component, whereas the corresponding y component is designated as warp_y_component. The linear interpolation based on the centers (x,y), (x,y+1), (x+1,y) and (x+1,y+1) is performed in accordance with the following relations.

warp_x_component=w00 * warp_x[x][y]

+w01 * warp_x[x][y+1]

+w10 * warp_x[x+1][y]

+w11 * warp_x[x+1][y+1]

warp_y_component=w00 * warp_y[x][y]

+w01 * warp_y[x][y+1]

+w10 * warp_y[x+1][y]

+w11 * warp_y[x+1][y+1]

where:

fx=y coordinate of cell fy=y coordinate of cell x=x coordinate rounded down to integer value y=y coordinate rounded down to integer value w00=(1.0−fx+x) * (1.0−fy+y)

w01=(1.0−fx+x) * (fy−0.0−y)

w10=(fx−0.0−x) * (1.0−fy+y)

w11=(fx−0.0−x) * (fy−0.0−y)

warp_x[a][b]=x component of warp map for the point (a,b)

warp_y[a][b]=y component of warp map for the point (a,b)

The density map repulsion force is rather inaccurate over small distances. In particular, a cell may be repulsed by its own attribution to the density map. However, since a warp map is calculated first, the force working on each of the density map centers due to itself is zero. This, together with the fact that forces are being calculated by interpolation in the warp map, cancel out a large part of the very short range forces. However, this means that a separate short-range repulsion force is needed to cover those interactions correctly as well.

Cell-to-cell repulsion strictly based on distance between cell centers tends to result in hexagonal cell patterns, since this is the densest stacking of discs in a plane. Also, repulsing two cells that do not overlap may be a bad decision if those cells are heavily interconnected and not in the way of any other cells. In such a case, these cells should be placed as close to each other as possible, without actually overlapping.

Using a cell-to-cell repulsion force based on amount of overlap between cells solves both these problems. When working with rectangular cells, the repulsion force will tend to settle the cells into a rectangular pattern, since it is the densest stacking for rectangular cells in a plane. A similar effect can be obtained by using a nonisotropic repulsion force with a rectangular force field. However, given the different shapes of the cells, it would be necessary to adapt the shape of the corresponding force field for each cell to get similar results.

Cells can be put as close to each other as necessary, as long as they do not overlap, since the repulsion force only becomes active as soon as there is actual overlap.

Figure 13:
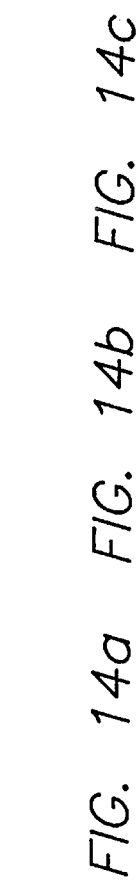
FIG. 13 is a diagram illustrating calculation of overlap area between two cells.

FIG. 13 illustrates how overlapping cells are separated in accordance with the present invention. This will reduce overlap that remains after performing the spatial distribution operation as described with reference to FIGS. 8 to 12.

Given two rectangular cells (x1a, x1b, y1a, y1b) and (x2a, x2b, y2a, y2b), where the coordinate labelled "a" is always smaller than the corresponding coordinate labeled "b" the overlapping area A is defined by:

A=0, if (x1a>x2b or x2a>x11 or y1a>y2b or y2a>y1b), or otherwise

A=(max(x1a,x2a)−min (x1b,x2b)).(max(y1a,y2a) min(y1b,y2b))

This calculation can then be used to calculate a repulsion force between the two cells in question, such that the distance by which one or both of the cells is moved is proportional to the overlap area A and results in reduction of the overlap.

A wide variety of functions can be used to calculate the actual forces. For example, the two cells can repulse each other along the line that joins through the center of both cells, with a force that is proportional to the amount of overlap as illustrated in FIG. 14*a*.

Figures 14A, 14B, 14C:
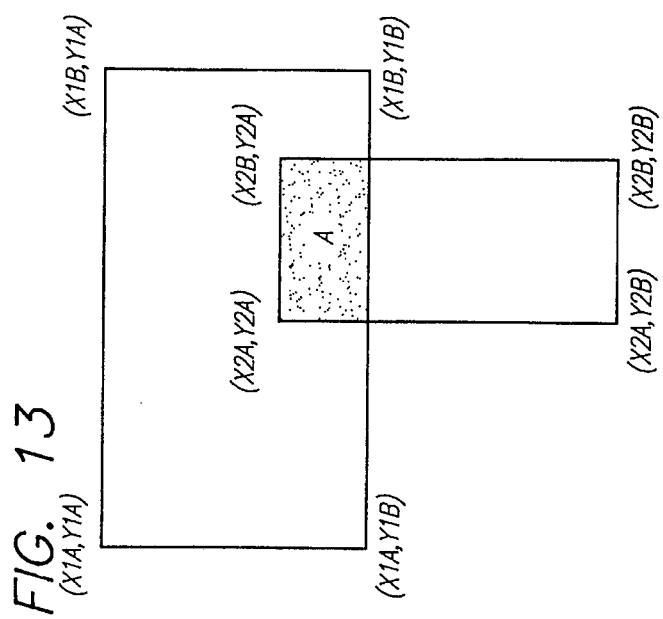
FIGS. 14a to 14c are diagrams illustrating movement of cells to remove overlap thereof.

Alternatively, the force acting on each cell can point straight away from the center of the overlapping region as illustrated in FIG. 14*b*, or the forces can point in a direction that is calculated to minimize the amount of cell movement needed to separate the cells as illustrated in FIG. 14*c*.

It will be understood that the cell overlap repulsion operation can be performed simultaneously in combination with the chaotic placement and spatial distribution operations in the manner described above.

In the chaotic cell placement method, one of the main problems is to make sure that a "legal" cell placement is produced in the end, i.e., none of the cells should overlap with any of the other cells. This can be achieved by first creating a "vague initial placement" which does not have to be completely legal, and then running a specialized placement algorithm to turn this into a legal placement.

Usually, this second step is fairly oblivious to the placement optimization issues that were being taken into account into the first step. Therefore, it is important to come already close to a legal placement at the end of the first step, in order not to have to distort the entire placement too much to make it legal.

This is accomplished in accordance with the present method such that the chaotic placement, repulsive spatial distribution and cell-to-cell overlap removal operations are preferably iterated a large number of times in alternation using a "schedule" to vary the importance of attraction and repulsion forces throughout the course of the operations.

Each of the different kinds of forces working on a cell (attraction based on netlist connections, attraction/repulsion based on density map, and repulsion based on cell overlap) will be scaled with a coefficient or scaling factor before being summed together to result in the total force on the cell, which then will be used to calculate the new position for the cell in the next iteration.

Figure 15:
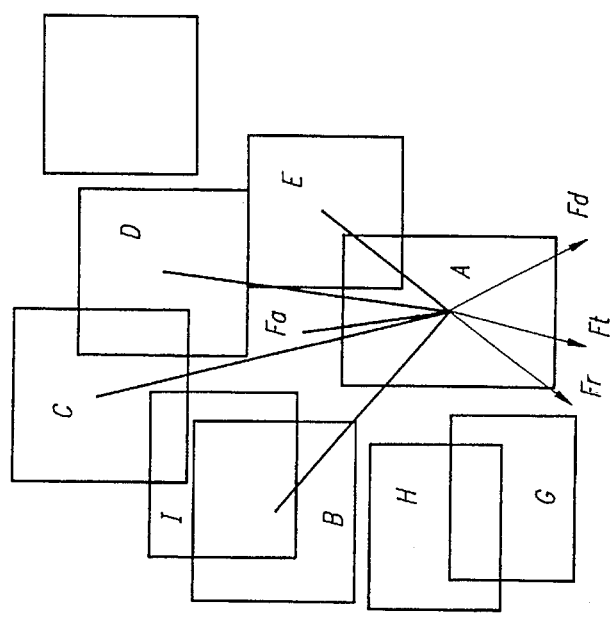
FIG. 15 is a diagram illustrating component forces used in the present method.

FIG. 15 illustrates how the different forces working on a cell interact. Cell A is connected to cells B, C, D and E. These connections result in an attraction force Fa. Because the cell density above and to the left of cell A is larger than the density to the right and below cell A, there will be a repulsion force Fd based upon density towards the lower right.

Furthermore, because cell A overlaps with cell E, there is a cell-to-cell repulsion force Fr away from cell E. Using a scaling factor of 1.0 for these three forces, the resultant force Ft will be the sum of these three forces. In general, we have $$Ft=\lambda Fa+\rho_1 Fd+\rho_2 Fr$$

However, by changing the scaling factors for the three forces, it is possible to increase or decrease their relative contribution to the force Ft that will be used to compute the next position for the cell A. Making these scaling factors a function of time ($\lambda(t)$, $\rho_1(t)$ and $\rho_2(t)$) allows the focus of the placement algorithm to be changed between the three optimization issues being taken into account (Fa tries to minimize wirelength, Fd tries to spread out cells, Fr tries to eliminate cell overlap).

There are a number of factors to be taken into account when choosing the exact functions (also called "schedules", in analogy to the temperature schedules used in simulated annealing) for these three forces.

The starting cell placement for iteration 0 of the chaotic placement usually contains little or no useful information (typically chosen at random, or all cells in the same point in the middle of the chip). It is therefore very important to allow for considerable cell movement at the start of the run, so that the cells do not get stuck in less-than-optimal positions caused by the initial positioning.

Figure 16:
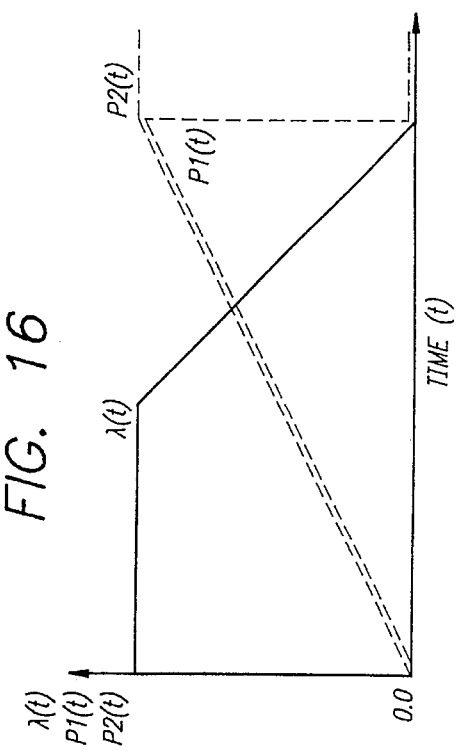
FIG. 16 is a graph illustrating scale factors for the components forces illustrated in FIG. 15.

As illustrated in FIG. 16, this implies using a fairly large $\lambda(t)$ during the beginning the run (allowing large cell movements), and a fairly small $\rho_1(t)$ and (especially) $\rho_2(t)$ to allow the cells to slide over each other fairly freely.

Gradually increasing the density map repulsion/attraction by turning up $\rho_1(t)$ during the length of the run makes sure that the chip gets filled up very smoothly, without too many large clusters or empty places.

Cell-to-cell overlap repulsion ($\rho_2(t)$) is complementary to density map repulsion, and is increased at the same rate. Whereas density map repulsion does a large-scale smoothing out of cell density on the chip, overlap repulsion eliminates small-scale clusters by repulsing individual cells.

Attraction between cells based on their connections (i.e., gravity point or minimum wirelength attraction) is essential to get a good wirelength score for the final placement. However, this attraction force will in general tend to pull the cells into each other. Therefore, after an initial phase to allow the internal structure of the netlist to express itself in the placement, the attraction force ($\lambda(t)$) should be turned down towards the end of the run.

The combination of these schedules will in general yield a fairly good, almost-legal solution. As a final phase, pure cell-to-cell overlap repulsion ($\lambda=0$, $\rho_1=0$, $\rho_2=1.0$) is applied until all overlap has been eliminated. If the final cell positions must be quantized to integer coordinates, all coordinates can then be rounded off. If this reintroduces some overlap, overlap repulsion and quantization can be repeated until all overlap has been eliminated after quantization.

These guidelines leave considerable room for flexibility in the choice of the exact schedules used. In fact, it is preferable to optimize the shape of the schedules for each class of chip design (based on cell technology, interconnectivity of the design, amount and size of megacells, etc.). The particular schedule illustrated in FIG. 16 for $\lambda(t)$, $\rho_1(t)$ and $\rho_2(t)$ is only a particular example of the present method.

Various modifications will become possible for those skilled in the art after receiving the teachings of the present disclosure without departing from the scope thereof.

We claim:

1. A computer implemented method of spatially distributing cells in a cell placement for an integrated circuit chip, comprising the steps of:

(a) computing a density map representing cell densities in incremental blocks of said placement respectively;

(b) computing, from the density map, a warp map representing first repulsive forces exerted at centers of said blocks by cell densities in surrounding blocks respectively;

(c) interpolating, from the warp map, second repulsive forces acting on selected cells in the placement; and (d) spatially distributing said selected cells in accordance with said second repulsive forces.

2. A method as in claim 1, in which step (a) comprises computing said cell densities as a predetermined function of areas of said incremental blocks that are overlapped by cells.

3. A method as in claim 2, in which step (a) comprises summing areas of said incremental blocks that are overlapped by cells.

4. A method as in claim 1, in which step (b) comprises computing said first repulsive forces as a predetermined function of distances from said centers to said surrounding blocks respectively.

5. A method as in claim 1, in which step (b) comprises computing said first repulsive forces as being inversely proportional to distances from said centers to said surrounding blocks respectively.

6. A method as in claim 1, in which step (b) comprises computing said first repulsive forces as being inversely proportional to squares of distances from said centers to said surrounding blocks respectively.

7. A method as in claim 1, in which step (c) comprises linearly interpolating said second repulsive forces.

8. A method as in claim 1, further comprising the steps, performed between steps (a) and (b), of:

(e) computing an average cell density from said cell densities; and (f) subtracting said average cell density from said cell densities.

9. A method as in claim 1, in which step (c) comprises selecting said selected cells as being overlapping cells.

10. A method as in claim 1, further comprising the steps, performed after step (d), of:

(e) identifying overlapping cells; and (f) moving at least one of said overlapping cells to reduce overlap thereof.

11. A method as in claim 10, in which step (f) comprises moving two overlapping cells in opposite directions.

12. A method as in claim 10, in which step (f) comprises moving two overlapping cells in opposite directions along a line joining centers of said overlapping cells.

13. A method as in claim 10, in which step (f) comprises moving two overlapping cells along lines joining centers of said two overlapping cells and a center of an overlapping area of said two overlapping cells.

14. A method as in claim 10, in which step (f) comprises moving two overlapping cells along lines joining centers of said two overlapping cells and a center of an overlapping area of said two overlapping cells respectively.

15. A method as in claim 10, in which step (f) comprises moving two overlapping cells in directions that require minimum movement to reduce said overlap thereof.

16. A method as in claim 10, in which step (f) comprises the substeps of:

(g) calculating an amount of overlap of two overlapping cells; and (h) moving at least one of said two overlapping cells by a distance corresponding to said amount of overlap.

17. A computer implemented method of improving a placement of cells for an integrated circuit chip, comprising the steps of:

(a) selecting and moving a plurality of first cells in accordance with a first predetermined function to reduce a cost factor of said placement;

(b) selecting and moving a plurality of second cells in accordance with a second predetermined function to improve a spatial distribution of said placement;

(c) altering said first and second predetermined functions to decrease a scale factor for movement of said first cells and increase a scale factor for movement of second cells respectively; and (d) repeating steps (a) to (c).

18. A method as in claim 17, further comprising the steps, performed prior to step (a), of:

(e) selecting and moving a plurality of first cells in accordance with said first predetermined function to reduce a cost factor of said placement;

(f) selecting and moving a plurality of second cells in accordance with said second predetermined function to improve a spatial distribution of said cells;

(g) altering only said second predetermined function to increase said scale factor for movement of said second cells; and (h) repeatedly performing steps (e) to (g).

19. A method as in claim 17, in which said first predetermined function in step (a) comprises chaotic placement.

20. A method as in claim 17, in which said first predetermined function in step (a) comprises performing the substeps of:

(e) computing centroids for said first cells in accordance with locations of cells to which said first cells are connected respectively;

(f) computing first distances from current locations of said first cells to said centroids respectively;

(g) computing second distances in accordance with a third predetermined function of said first distances respectively; and (h) moving said first cells from said current locations toward said centroids by said second distances respectively.

21. A method as in claim 17, in which said second predetermined function in step (b) comprises selecting said second cells as being overlapping cells.

22. A method as in claim 17, further comprising the steps, performed between steps (b) and (c), of:

(e) identifying overlapping cells; and (f) moving at least one of said overlapping cells to reduce overlap thereof.

23. A method as in claim 22, in which step (f) comprises moving two overlapping cells in opposite directions.

24. A method as in claim 22, in which step (f) comprises moving two overlapping cells in opposite directions along a line joining centers of said overlapping cells.

25. A method as in claim 22, in which step (f) comprises moving two overlapping cells along lines joining centers of said two overlapping cells and a center of an overlapping area of said two overlapping cells.

26. A method as in claim 22, in which step (f) comprises moving two overlapping cells along lines joining centers of said two overlapping cells and a center of an overlapping area of said two overlapping cells respectively.

27. A method as in claim 22, in which step (f) comprises moving two overlapping cells in directions that require minimum movement to reduce said overlap.

28. A method as in claim 22, in which step (f) comprises the substeps of:

(g) calculating an amount of overlap of two overlapping cells; and (h) moving at least one of said two overlapping cells by a distance according to said amount of overlap.

29. A method as in claim 22, in which:

step (f) comprises moving said at least one of said overlapping cells in accordance with a third predetermined function; and step (c) further comprises altering said third predetermined function to increase a scale factor for movement of said at least one of said overlapping cells.

30. A method as in claim 29, in which steps (a), (b), (c) and (f) are performed simultaneously in combination.

31. A method as in claim 29, further comprising the steps, performed after step (d), of:

(g) identifying overlapping cells;

(h) moving at least one of said overlapping cells to reduce overlap thereof; and (i) repeatedly performing steps (g) and (h) until all overlap has been removed.

32. A method as in claim 31, in which steps (g) to (i) are integral with steps (a) to (f), and comprise adjusting said first, second and third predetermined functions in accordance with a fourth predetermined function.

33. A method as in claim 17, in which said cost factor comprises interconnect wirelength.

34. A method as in claim 17, in which steps (a) and (b) are performed simultaneously in combination.

35. A method of improving a placement of cells for an integrated circuit chip, comprising the steps of:

(a) selecting and moving a plurality of first cells in accordance with a first predetermined function to reduce a cost factor of said placement;

(b) selecting and moving a plurality of second cells in accordance with a second predetermined function to improve a spacial distribution of said placement;

(c) altering said first and second predetermined functions to decrease a scale factor for movement of said first cells and increase a scale factor for movement of second cells respectively; and (d) repeatedly performing steps (a) to (c);

in which said second predetermined function in step (b) comprises performing the substeps of:

(e) computing a density map representing cell densities in incremental blocks of said placement respectively;

(f) computing, from the density map, a warp map representing first repulsive forces exerted at centers of said blocks by cell densities in surrounding blocks in the placement respectively;

(g) interpolating, from the warp map, second repulsive forces acting on said second cells; and (h) moving said second cells in accordance with said second repulsive forces.

36. A method as in claim 35, in which step (e) comprises computing said cell densities as a predetermined function of areas of said incremental blocks that are overlapped by cells.

37. A method as in claim 35, in which step (e) comprises summing areas of said incremental blocks that are overlapped by cells.

38. A method as in claim 35, in which step (f) comprises computing said first repulsive forces as a predetermined function of distances from said centers to said surrounding blocks respectively.

39. A method as in claim 35, in which step (f) comprises computing said first repulsive forces as being inversely proportional to distances from said centers to said surrounding blocks respectively.

40. A method as in claim 35, in which step (f) comprises computing said first repulsive forces as being inversely proportional to squares of distances from said centers to said surrounding blocks respectively.

41. A method as in claim 35, in which step (c) comprises linearly interpolating said second repulsive forces.

42. A method as in claim 35, further comprising the steps, performed between steps (e) and (f), of:

(i) computing an average cell density from said cell densities; and (j) subtracting said average cell density from said cell densities.

\* \* \* \* \*